United States Patent
Pickens et al.

(10) Patent No.: US 9,587,309 B1
(45) Date of Patent: Mar. 7, 2017

(54) ADDITIVE MANUFACTURING USING METALS FROM THE GASEOUS STATE

(71) Applicant: Concurrent Technologies Corporation, Johnstown, PA (US)

(72) Inventors: Joseph R. Pickens, Glenelg, MD (US); Juan Valencia, Johnstown, PA (US); Michael L. Tims, Hollsopple, PA (US)

(73) Assignee: Concurrent Technologies Corporation, Johnstown, PA (US)

( * ) Notice: Subject to any disclaimer, the term of this patent is extended or adjusted under 35 U.S.C. 154(b) by 221 days.

(21) Appl. No.: 14/215,694

(22) Filed: Mar. 17, 2014

Related U.S. Application Data

(60) Provisional application No. 61/792,398, filed on Mar. 15, 2013.

(51) Int. Cl.
| | | |
|---|---|---|
| C23C 16/01 | (2006.01) | |
| C23C 16/16 | (2006.01) | |
| C23C 16/44 | (2006.01) | |
| C23C 16/52 | (2006.01) | |

(52) U.S. Cl.
CPC .......... *C23C 16/4418* (2013.01); *C23C 16/01* (2013.01); *C23C 16/16* (2013.01); *C23C 16/52* (2013.01)

(58) Field of Classification Search
None
See application file for complete search history.

(56) References Cited

U.S. PATENT DOCUMENTS

| | | | | |
|---|---|---|---|---|
| 5,732,323 | A * | 3/1998 | Nyrhila | B22F 3/1007 419/2 |
| 6,048,578 | A | 4/2000 | Milinkovic et al. | |
| 6,132,518 | A | 10/2000 | Milinkovic et al. | |
| 6,165,428 | A | 12/2000 | Eijkhoudt et al. | |
| 6,428,601 | B2 | 8/2002 | Terekhov | |
| 6,751,516 | B1 * | 6/2004 | Richardson | B22F 3/1055 700/118 |
| 7,044,995 | B2 | 5/2006 | Khozan et al. | |
| 7,198,770 | B2 | 4/2007 | Khozan et al. | |
| RE41,099 | E | 2/2010 | Terekhov | |

(Continued)

OTHER PUBLICATIONS

Lu, X. et al., "Studies on ultrasonic microfeeding of fine powders", Journal of Applied Physics D: Applied Physics, vol. 39, pp. 2444-2453, May 18, 2006.*

*Primary Examiner* — George Wyszomierski
(74) *Attorney, Agent, or Firm* — Buchanan Ingersoll & Rooney PC

(57) ABSTRACT

A method of producing a 3-dimensional ("3-D") product from metals in the gaseous state includes the steps of providing a substrate of 3-D shape; providing a flow of a gaseous chemical compound(s) around the 3-D substrate, wherein the gaseous chemical compound(s) comprises a metal carbonyl gas; selectively heating the 3-D substrate to decompose the metal carbonyl gasses, wherein metal separated as a result of the decomposition is deposited on the 3-D substrate; selectively controlling the flow rate of one or more metal carbonyl gasses and the temporal and spatial temperature distribution throughout the 3-D substrate to achieve a desired thickness distribution of the metal or metals on the 3-D substrate; and removing the 3-D substrate to produce a resulting 3-D metal product with an complex geometry.

19 Claims, 2 Drawing Sheets

(56) References Cited

U.S. PATENT DOCUMENTS

| | | |
|---|---|---|
| 7,776,129 B2 | 8/2010 | Curlook et al. |
| 8,092,573 B2 | 1/2012 | Terekhov et al. |
| 2013/0126295 A1 | 5/2013 | Decker |
| 2013/0344258 A1 | 12/2013 | Covey |

* cited by examiner

ADDITIVE MANUFACTURING USING METALS FROM THE GASEOUS STATE

CROSS-REFERENCE TO RELATED APPLICATIONS

This patent application claims the benefit of U.S. Provisional Patent Application No. 61/792,398, filed on Mar. 15, 2013, which is hereby incorporated by reference in its entirety.

FIELD OF THE INVENTION

The present invention is directed toward additive manufacturing processes in general and, more particularly, toward the additive manufacturing of 3-dimensional ("3-D") products from metals and other materials added from the gaseous state.

BACKGROUND OF THE INVENTION

Additive manufacturing ("AM") is a technology by which 3-dimensional ("3-D") geometrically complex parts can be designed on a computer, and data protocols are used to produce the near-net 3-D shaped part directly from a computer-aided design ("CAD") or computer-aided manufacturing ("CAM") file. In most common AM processes, material is built up by melting or otherwise building up successive layers of material in different shapes to form a resultant 3-D product. Additive manufacturing, also known as "3-D printing", is considered distinct from traditional machining techniques, which mostly rely on the removal of material by methods such as machining, filing, turning, milling, grinding, cutting, drilling, etc. In these traditional machining techniques, a base product is formed, and then material is removed therefrom by various known methods to form the resultant 3-D product. Such traditional manufacturing processes that rely on the removal of material are often referred to as "subtractive manufacturing" processes.

Additive manufacturing takes virtual blueprints from CAD/CAM files or animation modeling software and slices them into digital cross-sections for the AM machine to successively use as a guideline for printing. Depending on the AM machine used, material, often with a binding material, is deposited on a build bed or platform in successive layers until the material/binder layering is complete and the final 3-D model has been printed. AM processes are used to make a variety of parts in a range of industries including, but not limited to, jewelry, footwear, industrial design, architecture, engineering and construction ("AEC"), automotive, aerospace, dental and medical industries, education, geographic information systems, civil engineering, and many other fields and industries.

Early AM processes were performed by 3-D printing solid powders in modified inkjet-type printers. While such processes have been comparatively easy for polymers, the 3-D printing of metals has proved to be much more difficult. One prior art technique developed in the 1990s involved the 3-D printing of stainless steel powders mixed with a fugitive organic binder and, at times depending on the particular application, thermoplastic powders. After each printing pass (i.e., deposition of each successive layer of material), a light source cured the polymer to give the additive layer some "green" (i.e., un-sintered) strength. After the 3-D part was built up, it was sintered to make a rigid skeleton of stainless steel, with the fugitive binder and any thermoplastic powder particles melted or burned away. Due to the removal of the fugitive binder and thermoplastic powder, the resulting skeletal stainless steel structure had interconnected porosity. Bronze alloys were identified with good wettability to the stainless steel alloy and were used to finish the 3-D product. The stainless steel skeletal structure could be infiltrated with the bronze alloy by, for example, capillary forces without the need for applied pressure or vacuum assist. While the resulting metal composite product exhibited good strength—approaching, for example, 100 ksi tensile strength—it would typically corrode in moist air and had a high density of about 8.5 g/cm$^3$, depending on the initial porosity of the stainless steel skeletal structure.

AM technology developed rapidly for polymer feedstocks, primarily because melting temperatures for such polymer feedstocks are typically low. The feedstocks could be polymer powders or polymer wire that was melted as the 3-D part was built up. In both cases, the solid feedstock (whether powder or wire) is melted to the liquid state as it is deposited onto the 3-D structure during the AM process, and then cooled to the solid state.

AM technology for metals has been advancing, but the generally high temperatures needed to melt the metals to a liquid state, as well as the oxidation susceptibility of metals, have proven to be difficult obstacles to the widespread application of metal AM techniques. In some known AM techniques, metal powders are fabricated (by atomization, grinding or other means) and are used as feedstocks that are placed into a powder bed. A computer-controlled laser selectively melts regions of the metal powder initially against a metal substrate that serves both as a structural support and a cooling heat sink. After melting a layer of the metal powder onto the metal substrate, the metal powder level is refreshed by spreading or otherwise adding another layer of metal powder on top of that already processed and the technique repeated. This continues until the 3-D part is complete.

However, this technique has several disadvantages including, but not limited to: (1) the laser-sintered parts are essentially welded to the metal substrate and they must be cut off; (2) the build-up of overhanging structure is limited, so support structures for these overhanging structures often have to be built up and machined off; (3) the metal powders are generally expensive and can have consistency issues; (4) the working envelopes are small and expensive in that an AM machine to perform such a process with a one cubic foot envelope currently costs about $600,000; and (5) the metal alloys that are amenable to such techniques are currently limited.

Wire-fed AM processing for metals is a technology pioneered by Sciaky Inc. In such processing, solid wire is fed to a substrate and is then melted to the liquid state by, for example, an electron beam ("EB"). The 3-D structure is built up under CAD/CAM control by what is essentially welding. The working envelop for this technique is generally larger than for other AM techniques. For example, Sciaky Inc. has claimed that 3-D parts as large as 19 feet×4 feet×4 feet can be made using wire-fed AM processing. However, the feature size possible by this technique is quite coarse and the large heat input from the electron beam causes significant residual stresses, which can lead to component distortion. Furthermore, metallurgical defects are undesirably high when using the wire-fed AM technology without adequate process controls.

The commercialization of AM processing for polymer printing is quite mature with many companies available to quote prices to build a limited production run of 3-D printed parts. In fact, polymer AM machines are now available to consumers at relatively low cost as, for example, a child's educational toy, such as the $1200 Cube 3-D Printer by 3D Systems that prints polymer-based parts from a plastic wire feed. However, there is not as much commercial infrastructure for metal AM processes, and there are a limited number of metals and metal alloys that have been successfully 3-D printed up to the present time. In all of the AM work to date, all metal feedstocks are wires or powders, namely solids, that are melted and solidified to form the resultant AM 3-D part. There is thus a need for AM processing techniques that expand the number of metals that can be practically manufactured. Furthermore, AM processing for ceramics is far behind that for metals and polymers.

In a series of patents awarded to Chemical Vapour Deposition Systems, Inc. (also known as CVMR Corporation), Toronto, Canada, methods for production of high-purity nickel and methods for coating nickel onto objects using carbonyl gasses are discussed:

"Nickel Carbonyl Vapour Deposition Apparatus and Method," U.S. Pat. No. 6,132,518, issued Oct. 17, 2000.

"Nickel Carbonyl Vapour Deposition Process," Canadian Patent Number 2,206,217, Jan. 7, 2003.

"Nickel Carbonyl Vapour Deposition Apparatus and Process," Canadian Patent Number 2,307,036, May 27, 2003.

"Closed Loop Carbon Monoxide Self-Contained Nickel Carbonyl Deposition Process," U.S. Pat. No. 6,048,578, Apr. 11, 2000.

Claims in these patents identify methods for a continuous process for producing pure nickel or producing pure nickel coatings on objects from impure feedstock. The focus of these claims is the production of elemental nickel. However, no mention is made of producing nickel components of a desired shape and thickness by the use of nickel carbonyl gasses.

The present invention is directed at overcoming one or more of the above-identified problems.

SUMMARY OF THE INVENTION

The present invention incorporates the novel approach of performing additive manufacture processes of 3-D products using metals from the gaseous state.

A method of producing a 3-dimensional ("3-D") product from metals in the gaseous state is provided, the method including the steps of providing a substrate of 3-D shape; providing a flow of a gaseous chemical compound around the 3-D substrate, wherein the gaseous chemical compound comprises a metal carbonyl gas; selectively heating/cooling regions of the 3-D substrate to decompose the metal carbonyl gas, wherein metal separated as a result of the decomposition of the metal is deposited on the 3-D substrate; and controlling a flow rate of the metal carbonyl gas and the temporal and spatial temperature distribution of the 3-D substrate to achieve a desired spatial thickness distribution (uniform or non-uniform, as desired) and quality of the metal on the 3-D substrate.

In one form, the method further includes removing the 3-D substrate to produce a resulting 3-D metal product.

The 3-D substrate can include a plastic or polymer 3-D substrate, with the plastic or polymer 3-D substrate removed by melting, dissolving, chemical removal or burning to produce the resultant 3-D metal product. The 3-D substrate can further include a plastic or polymer 3-D substrate formed from an additive manufacturing process.

The metal in the metal carbonyl gas can include nickel or iron, or other transition metals such as those in Groups 5-10 (Groups VB to VIIIB) of the Periodic Table.

The inventive system and method allows the 3-D substrate to be selectively heated/cooled to temporally and spatially varying temperatures that are less than the melting point(s) of the metal(s) included in the metal carbonyl gas molecular constituents.

In another form, the flow rate, pressure and temperature of the metal carbonyl gas and the temporal and spatial varying temperature distribution of the 3-D substrate are controlled by a CAD/CAM file.

A doping gas or gases may be added to the metal carbonyl gas to improve the properties of the deposited metal. The doping gas or gases can include in their molecular make-up, for example, boron, silicon, nitrogen and/or carbon, or other elements as molecular constituents designed to improve the mechanical, physical and/or other properties of the deposited metal. In addition, other elements may be added to the metal carbonyl gas to provide corrosion resistance; desired porosity levels; selected grain size, type and orientation; metal purity; component color and/or wear resistance for the deposited metal.

In a further form, the 3-D substrate includes at least one passageway formed therein, the at least one passageway receiving at least one heating or cooling fluid to selectively heat/cool regions of the 3-D substrate and selectively control the spatial and temporal deposition rate of the metal throughout the surface of the 3-D substrate.

In yet a further form, the 3-D substrate includes a plurality of passageways formed therein, the plurality of passageways receiving one or more heating/cooling fluid(s) heated/cooled to a select temperature to selectively heat/cool regions of the 3-D substrate and selectively control the spatial and temporal deposition rate of the metal throughout the surface of the 3-D substrate. The select temperature(s) of the heating/cooling fluid(s) in the plurality of passageways can be different in each passageway and over time to achieve desired spatial variations in thickness of the metal deposited on the 3-D substrate. Furthermore, one or more of these fluids can have its temperature altered in time to selectively control the spatial metal deposition rate over time. It is contemplated herein that different types of heating/cooling fluids or heating/cooling mediums may be provided in the plurality of passageways.

In still a further form, the 3-D substrate includes particles selectively disbursed therein to selectively spatially control the thermal conductive properties throughout the 3-D substrate. Additionally, the 3-D substrate can include one or more phase-change materials, such as, but not limited to, those materials that melt at a selected and desired temperature or within a narrow range of temperature, selectively embedded therein to selectively maintain tight temperature control in desired regions of the 3-D substrate. The 3-D substrate can also include at least one embedded induction or resistant heater or hot plate to selectively control the spatial and temporal temperature of the 3-D substrate, thereby controlling the spatial and temporal metal deposition rate. The heated fluid, embedded heaters and/or hot plates can also be used to melt or burn out the substrate for removal of the substrate material at any point during the build, including after completion of the build.

A method of producing a 3-dimensional ("3-D") product from metals in the gaseous state is also provided, the method including the steps of providing a substrate of 3-D shape; providing a flow of a gaseous chemical compound around the 3-D substrate, wherein the gaseous chemical compound comprises a metal carbonyl gas; selectively heating/cooling the 3-D substrate to selectively decompose the metal carbonyl gas, wherein metal separated as a result of the decomposition is selectively deposited on the 3-D substrate, wherein different regions of the 3-D substrate are temporally heated/cooled to different temperatures (some substrate regions within the carbonyl decomposition temperature range and other regions of the substrate outside this temperature range) such that the metal is deposited in different thickness on the different regions of the 3-D substrate and/or previously deposited material; selectively controlling a flow rate and pressure of the metal carbonyl gas and the temporal and spatial temperature distribution within the 3-D substrate to achieve a desired spatially varying thickness of the metal on the 3-D substrate; and removing the 3-D substrate to produce a resulting 3-D metal product.

In accordance with the present invention, an additive manufacturing process is provided by which geometrically complex objects can be made by conventional 3-D printing processes including, but not limited to, selective laser sintering of polymers, metals and ceramics, as well as electron beam deposition, and then increasing dimensions on any or all free surfaces by deposition of metal and other elements from the gaseous or plasma state, wherein the conventionally 3-D printed part can be melted or dissolved away leaving a net shape metal part, or the conventional 3-D printed part and the added metal or other material used in conjunction as a composite part. At least some of the gas or gases and/or their chemical constituents used can be deposited by chemical vapor deposition processes. At least some of the gas or gases and/or their chemical constituents used can be deposited by physical deposition processes. These chemical or physical deposition processes can be used to develop additional component features that supplement and add additional desired mechanical, physical or other properties to the material deposited though the carbonyl process.

The present invention has an advantage that different metals can be deposited in the through-thickness direction as selected regions throughout a part via introduction of various CVD, PVD and/or carbonyl gasses/materials at selected stages of part build The present invention has a further advantage that high-melting-point metals can be additive manufactured at temperatures significantly lower than those used for conventional metal additive manufacturing fabrication processes.

In one form, the present invention incorporates a process and machine by which a CAD file, a CAM file, or other computer control uses external heating/cooling sources to control temporal and spatial temperatures for increased or decreased thickness of added metal from a gaseous or plasma state to a substrate.

An additive manufacturing process is disclosed herein by which complex objects can be made by conventional 3-D printing processes using conductive polymers, which are then subjected to additional additive manufacturing by electroplating or electroless plating.

An additive manufacturing process is further disclosed herein by which complex objects can be made by conventional 3-D printing processes using conventional, non-electrically conducting polymers, which are then sprayed, painted, or physical vapor deposited with a conducting material, and then subjected to additional additive manufacturing by electroplating or electroless plating.

It is an object of the present invention to form 3-D products from metals deposited from a gaseous or plasma state at temperatures lower than the melting point of the respective metals.

Various other objects, aspects and advantages of the present disclosure can be obtained from a study of the specification, and the appended claims.

DETAILED DESCRIPTION OF THE INVENTION

Figure 1:
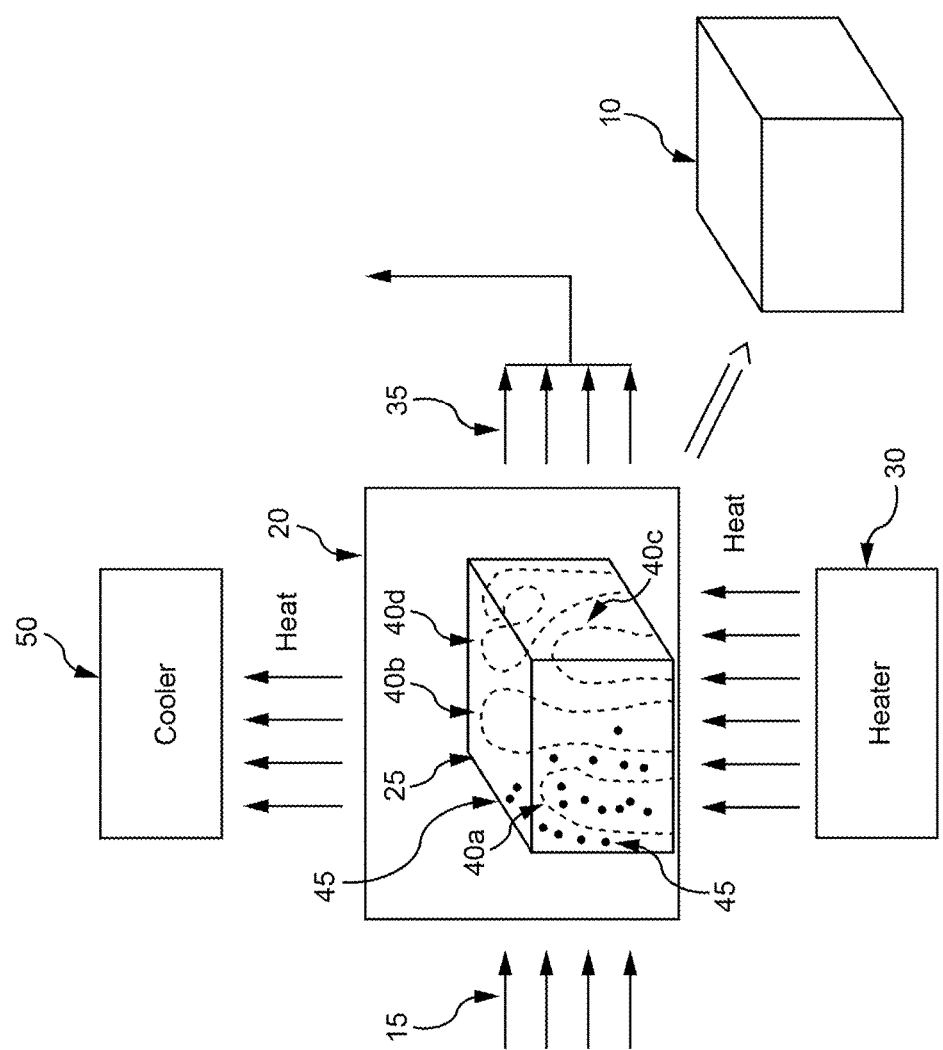
FIG. 1 illustrates a process flow diagram of the additive manufacturing system and method in accordance with the present invention.

The present invention is directed toward a system and method for the AM processing of 3-D products using metals from the gaseous state. In a general sense, one embodiment of the inventive system and method pulls metals in a gaseous form off of a substrate or other feedstock item using a chemical process harnessing the affinity of various radicals for certain transition metals. The gas containing the chemicals is then provided to a deposition chamber, which houses a 3-D substrate made from, for example, plastic or other polymer material. In the deposition chamber, the process is reversed and the metal atoms are separated from the gas by applying heat to the chamber and/or the substrate, and the metal is deposited on the substrate. The metal is built up on the substrate using AM techniques until a desired thickness is achieved. The plastic/polymer substrate may then be burned off, dissolved away, melted off, or otherwise removed by, for example, heating and the like, leaving a final 3-D metal product having the desired spatially varying thickness in various regions of the product. In addition, the plastic/polymer substrate may be left in situ for certain applications.

Vapor Deposition Processes

Chemical vapor deposition ("CVD") is a class of processes by which volatile precursors, which may be gaseous, liquid or solid, react or decompose on a surface to produce a solid film. (See e.g., J. R. Creighton and P. Ho, "Introduction of Chemical Vapor Deposition (CVD)," Product Code #06682G, ASM International, Materials Park, Ohio, http://tss.asminternational.org/content/ASM/StoreFiles/ACFAA6E.pdf). The film may be loosely bonded by, for example, Van der Waals forces, or chemisorbed thereby forming stronger covalent bonds. The CVD process is often used in the semiconductor industry to produce thin films.

Physical vapor deposition ("PVD") is a family of purely physical deposition processes by which a volatile substance condenses, without decomposing, on a surface to form a solid film. (See e.g., Donald M. Mattox, *Handbook of Physical Vapor Deposition (PVD) Processing*, Second Edition, Elsevier Incorporated, Oxford, United Kingdom, 2010). Although many commercial PVD processes involve deposition under vacuum, a simple example of a naturally occurring PVD process is water vapor condensing on a cold surface to form ice. Variants of the PVD process include, but are not limited to, cathodic arc deposition, electron beam deposition, evaporation deposition, pulsed-laser deposition and sputter deposition. In accordance with the present invention, materials are deposited by any CVD or PVD process over substrates made by 3-D printing or other additive manufacturing techniques. Most CVD processes involve gases, although some CVD processes involve plasmas. This additive manufacture from the gaseous state may comprise metals, but also may comprise ceramics and/or organic compounds.

Carbonyl Process

One particularly useful and versatile CVD process is the carbonyl process, or Mond process, as it is also known. (See e.g., "Ludwig Mond: Great Chemist-Industrialist, Alfred Mond (Lord Melchett): Great Zionist Leader," Bob Weintraub, Negev Academic College of Engineering, http://www.chemistry.org.il/booklet/14/pdf/weintraub.pdf). This carbonyl process was first discovered around 1890 by Ludwig Mond when he noticed that hot carbon monoxide gas would severely corrode nickel. The Mond process was originally created to extract and purify nickel, and has been practiced commercially since the early 1900s. It is done by converting nickel oxides (nickel combined with oxygen) into pure nickel.

The Mond process exploits the ability of carbon monoxide to form complexes with nickel readily and reversibly to provide nickel carbonyl. Nickel carbonyl is formed by the exposure of powdered nickel (Ni) to carbon monoxide gas at temperatures of around 40-100° C. Nickel carbonyl is stable as nickel tetracarbonyl, which has four carbon monoxide (CO) molecules bonded to the nickel atom. The reaction is as follows:

$$Ni(s)+4CO(g) \rightarrow Ni(CO)_4(g) \quad (Eq. 1)$$

At approximately 150-300° C., the above reaction is reversed in which the nickel carbonyl decomposes to produce solid nickel and CO gas. This nickel can be manipulated to form a deposit on a substrate, and preferably a 3-D substrate in accordance with the present invention. The thickness of the vapor-plated deposit can be increased to desired thicknesses by controlling the amount of metal carbonyl used, the duration of the plating process, and the heating/cooling of the substrate and/or chamber. The reaction is as follows:

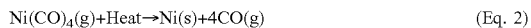

$$Ni(CO)_4(g)+Heat \rightarrow Ni(s)+4CO(g) \quad (Eq. 2)$$

While it has been found that the Mond carbonyl process works particularly well with nickel and iron (Fe), the carbonyl process exploits the ability of carbon monoxide to form compounds with, for example, at least eighteen transition elements, and complexes of these elements, in Groups 5-10 of the Periodic Table (or Groups VB to VIIIB in the nomenclature recommended by the International Union of Pure and Applied Chemistry), including, but not limited to, vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd) and platinum (Pt). That is, nickel, or other metals, can be removed from a substrate or other material, and also deposited onto a substrate or other material, depending upon the temperature of the substrate and/or the chamber. The Mond carbonyl process can be used to manufacture coatings of nickel, iron and other transition metals. Coatings are produced by vapor plating using metal carbonyls. The carbonyls are complex metal-ligands where carbon monoxide is bonded in a pendant ligand structure to the individual atoms of the transition metals.

Depending on the metal used, the temperature ranges implemented in Equations 1 and 2 above can vary. The carbonyl CVD process can be used to deposit nickel on most substrates. The process has the ability to extract nickel, for example, from low-cost, low-value-added sources, such that it is significantly cheaper to produce or extract nickel than by conventional extraction process metallurgy. As an example, about one hundred million pounds of nickel are produced each year by the carbonyl process, demonstrating that the process is very mature and effective for nickel extraction. It is projected that the nickel produced by the carbonyl process can be used to deposit nickel onto substrates at significantly lower prices than the prevailing commercial nickel price.

In accordance with the present inventive method and system, virtually any CVD or PVD gaseous process can be exploited and used to build up complex, thin or bulk structures from metals in the gaseous state.

It is significant that the carbon monoxide can extract Ni and other metals from low-grade ores or reclaim Ni and other metals from recycled parts at low temperatures. For example, nickel-carbonyl gas can be formed at approximately 40-100° C. from Ni-containing feedstocks, which can comprise ores. Thus, if desired, additive manufacturing of Ni can occur at temperatures not exceeding 300° C. anywhere in the process cycle. This is in contrast to AM processes by selective metal laser sintering where the nickel powder feedstock is melted at localized temperatures above 1,455° C. by lasers, electron beams, or other heating elements. Use of lower AM temperatures reduces energy usage and reduces processing complexities associated with higher temperatures.

For example, refractory metals, such as tungsten (W), rhenium (Re), molybdenum (Mo), etc., are very expensive to make using conventional refining processes and have to be made at extremely high temperatures, and are often done by sintering powders. The present inventive system and method permits the use of refractory metals in AM processing at relatively low temperatures from the gaseous state.

In an advanced embodiment of the present invention, a 3-D printed or other part can be heated to the lower part of the carbonyl deposition range, such as for nickel. External heat sources such as, for example, lasers, infrared lamps, or induced eddy current sources for metal substrates, can be used to control the spatial and temporal temperature of the substrate and/or chamber to that in which the maximum or other desirable deposition rate is realized. These temperatures may vary depending on the metal used and/or the desired localized rate of metal deposition. The external heat sources can be controlled, for example, by a CAD/CAM file. In this way, different thicknesses of the metals throughout the 3-D component can be additive manufactured as desired. Additionally, different metals can be selectively layered throughout the 3-D component using this inventive AM technique. For certain geometries, mechanical masking of the substrate can be used where no gaseous AM layering is desired.

As shown in FIG. 1, a resultant 3-D product 10 is produced by inputting or feeding a metal carbonyl gaseous compound (e.g., nickel carbonyl), shown at 15, into a deposition chamber 20 having a 3-D substrate 25 therein. The metal carbonyl gas 15 is input/fed to the deposition chamber 20 and the substrate 25 and/or the chamber 20 is heated by, for example, a heater 30. Heating the substrate 25 and/or the chamber 20 (e.g., to approximately 150-300° C., and in any event, to a temperature less than the melting point of the metal) will cause a reverse carbonyl reaction and the metal atoms in the metal carbonyl gas will separate and deposit on the substrate 25. As required to further control the spatial and temporal temperature of the substrate, a cooling system 50 can also be used to lower the temperature of selected regions of the substrate 25 and/or the chamber 20. The CO gas, shown at 35, output from the chamber 20 can be recycled or otherwise processed and/or disposed of. The 3-D printing of the metal atoms onto the substrate 25 can be controlled, for example, by a CAD/CAM file.

The thickness of the metal atoms deposited on the substrate 25 can be controlled by controlling the heating/cooling of the substrate 25 and/or the chamber 20, controlling the flow rate and/or pressure of the metal carbonyl gas 15, as well as controlling other process parameters as will be appreciated by one of ordinary skill in the art. The process may take place continuously until a desired thickness distribution for the resultant 3-D product 10 is achieved. The substrate 25 (which is preferably made of a polymer or thermoplastic material) may be melted, dissolved or burned away or otherwise removed via conventional methods to produce the resultant 3-D product 10. The inventive system and method permits the resultant 3-D product 10 to take virtually any complex or intricate shape, such as, but not limited to, gears, rotors, tanks, shells, tubing, piping, etc., which may have various apertures extending there through, cross-sections, sizes, shapes, etc. further adding to their complexity.

In an additional embodiment, the process may be performed in steps, by first depositing a first layer of metal on the substrate 25. Additional layers of metals, which may be the same or different, may then be deposited on previously deposited metals (from any CVD, PVD, or other process, including the carbonyl process) on the 3-D substrate 25 using the above described process. In this manner, the resultant 3-D product 10 may encompass a layered structure of the same or different metals. In addition, the metal carbonyl gas need not be a pure metal carbonyl gas, and may include a metal compound carbonyl gas made from two or more metals. In some embodiments of the present invention, the gas stream may include gases other than those of carbonyl composition to act as catalysts and/or permit complex alloys or metal composites to be deposited.

An element of gaseous deposition that relies upon the carbonyl process is providing a heated substrate. A heated substrate is required since the temperature at which the metal deposition occurs (i.e., the carbonyl process reverses) is higher than where the metal carbonyl gas develops. To ensure that little or no metal deposition occurs on the chamber walls, the carbonyl gas should be kept at a temperature below the deposition temperature. The substrate 25 is heated to the deposition temperature, which causes the metal atoms to deposit thereon.

Several known methods exist to heat and control the substrate 25 to the desired spatial and temporal temperature distribution. The substrate 25 may itself be formed from a polymer or other thermoplastic material via an additive manufacturing process or by other means. In forming the substrate, passageways (shown at 40 in FIG. 1) could be introduced in the substrate during the build of the substrate. The passageways 40 could be used to circulate hot/cold fluid or other heating/cooling medium in selective regions of the substrate 25 to enable the substrate 25 to reach temperatures, either globally or in selected regions, which will lead to the desired metallic deposition either globally or in selected regions.

The passageways 40 could be singular or multiple in number and could take on a variety of cross-sectional sizes and shapes that best ensure the desired localized temperatures of the substrate 25. Fluids or other heating/cooling media of different temperatures and/or composition can be provided in the passageways 40, via the heater 30/cooler 50, to aid in the desired temperature distribution for the substrate 25. Temperatures and flow rates of the heating/cooling fluids and other heating/cooling media can be varied throughout the deposition process to yield desired local build thicknesses and/or to acquire other desired properties. For example, each of the passageways 40a, 40b, 40c, 40d shown on FIG. 1 could have a different heating/cooling fluid flowing through it at a different temperature and flow rate to selectively control the build rate of the metal in selective regions of the substrate 25. This controlled heating/cooling of the substrate 25 enhances the ability of the inventive system and method to produces very complex resultant 3-D products, which can vary in thickness, through-thickness composition and other properties.

In a further embodiment, particles 45 (e.g., fine powders, fibers, flakes, rods, beads and/or other particles) can be selectively or universally added to the polymer mix to locally and/or globally modify the thermal conductive properties of the substrate 25. Such fine powders, fibers, flakes, rods, beads and/or other particles can aid in further controlling the temperature uniformity or non-uniformity throughout the polymer substrate 25 to further selectively control the local and/or global metal build rate of the resultant 3-D product. The particles 45 (which can be powders, fibers, flakes, rods, beads, and/or other similar forms) could include, for example, pure metals, metallic alloys, ceramics hollow or solid spheres or other shapes, or any other material that can alter the effective thermal properties of the substrate 25.

Figure 2:
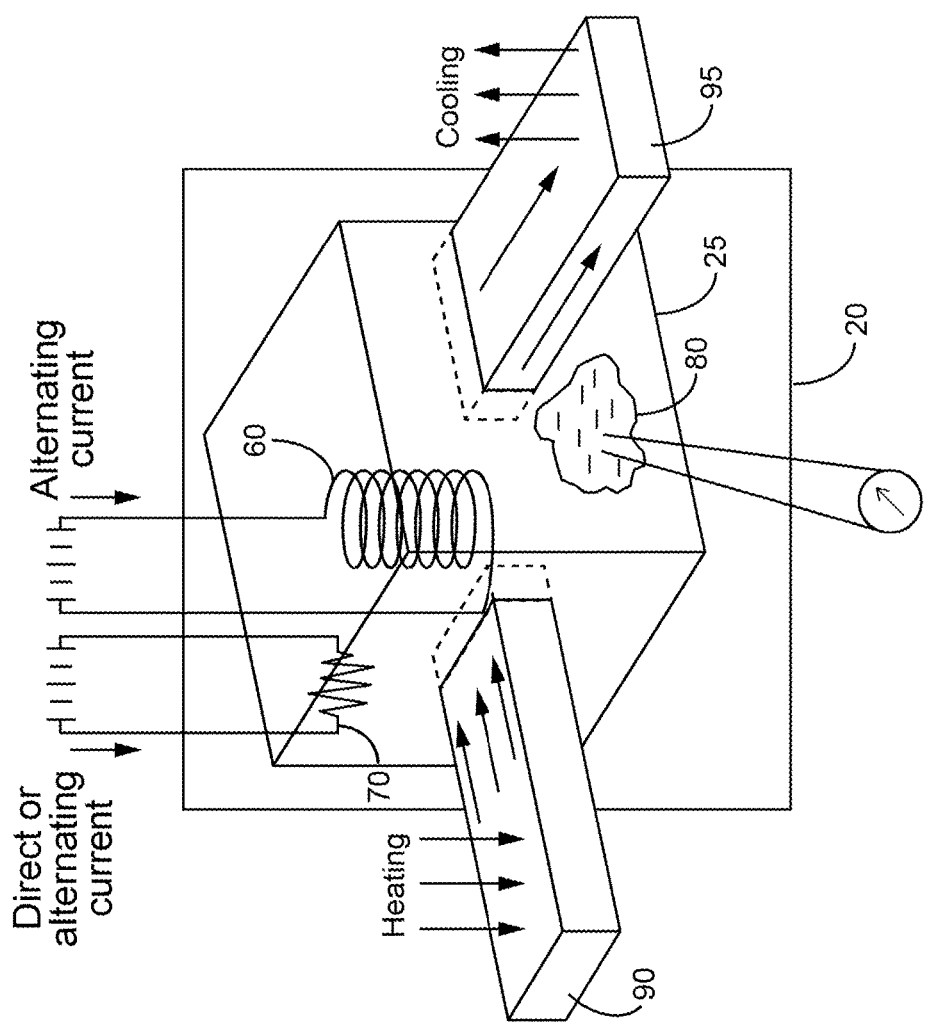
FIG. 2 illustrates a process flow diagram of the additive manufacturing system and method in accordance with an alternate embodiment of the present invention.

In still a further embodiment shown in FIG. 2, induction heat could be applied, either externally or internally to the substrate 25. One or more induction coils 60 could be buried in the substrate and would thus be kept from metal build up. Other heating methods could also include, for example, an embedded resistant heater 70, use of a heated substrate with an embedded phase change material 80 heated to the desired deposition temperature, as well as embedded hot/cold plates 90/95, which have a high thermal conductivity and are heated/cooled with a source outside the deposition chamber.

The above described methods of selectively heating/cooling the substrate 25 reduce issues associated with line-of-sight methods such as, for example, lasers or other electromagnetic radiation processes. For example, shapes that have reentrant features could not be properly coated with line-of-sight heating methods. Areas in the reentrant regions would not receive laser energy, for example, and would not be properly heated and thus not be properly coated with the deposited metal using the carbonyl process.

In addition, to accommodate the need for high-quality, selective coverage of the deposited metal on the substrate and/or previously deposited materials being coated by the inventive gaseous deposition method, baffles (not shown) can also be used. Further, the parts (i.e., substrate) can be carefully oriented with respect to the gas inflow and outflow ports to further help ensure proper coverage of the deposited materials.

One skilled in the art will appreciate that very complex and unique 3-D geometric parts can be produced by selectively controlling temporal and spatial temperature and its distribution on the substrate as discussed above, in conjunction with selective control of the temporal flow rate, pressure and temperature of the metal carbonyl gas input to the chamber. As noted previously, the entire process can be controlled by a CAD/CAM file. A virtually infinite number of geometries, thicknesses, metal distributions, etc. are available.

Other Transition Elements and Metals

Reversible carbonyl reactions are possible for at least up to eighteen transition elements, and complexes of those elements, in Groups 5-10 (Groups VB to VIIIB) of the Periodic Table. These elements include, but are not limited to: vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd) and platinum (Pt). However, it is contemplated that other metals and transition metals, including complexes of those metals, may be utilized for such AM processing techniques by using other CVD or PVD processes and radicals other than the carbonyl radical.

For example, iron is a very useful metal and can be readily used for additive manufacture by CVD or PVD processes at temperatures far lower than the temperatures reached and needed in selected metal laser sintering or wire-fed electron beam melting. Importantly, different CVD or PVD gases can be fed into the deposition chamber sequentially to deposit layered structures having different metal layers. In addition, unlimited mixtures of different carbonyl gases can be fed into the chamber concurrently to form various alloys, which may develop in situ or from subsequent manufacturing processing, including but not limited to specialized heat treatments, after the component's shape has largely been defined by the above additive manufacturing teachings. This is particularly promising for forming the intermetallic $Ni_3Fe$, the main constituent on naturally occurring minerals called Awaruite and Josephinite, which have been observed to withstand millennia in aqueous corrosive environments without significant corrosion.

Additive Manufacturing with Surface Engineering for Special Effects

Iron and steels generally suffer from the problems of rust and corrosion and cost the U.S. tens of billions of dollars annually. To help overcome these problems, in accordance with the present invention, a steel part, fabricated conventionally or by conventional additive manufacturing in, for example, a selective metal laser sintering or wire-fed electron beam deposition system, can be subjected to an additional additive manufacturing step for corrosion and/or wear protection. For example, a steel part can be placed in a CVD or PVD deposition chamber and a chromium- or nickel-depositing gas infused into the chamber. If using chromium as the metal, a layer of chromium will be added to the surface thereby providing a physical barrier to rust and corrosion. In addition, a diffusion annealing could be performed to alloy chromium atoms into the substrate steel, essentially forming a graded stainless steel on the surface akin to alloys 430 (Fe-19Cr), 405 (Fe-13Cr) and 409 (Fe-11Cr) as a function of distance from the surface. Thus, if the additive manufactured layer of Cr is penetrated, the substrate will be a stainless steel in the region that contacts the environment. It is useful that the chromium can be added without processing that involves hexavalent chromium, a known carcinogenic material.

Similarly, CVD reaction involving Ni and Cr can be deposited to form 3xx surface regions akin to austenitic alloys 304 and 316, which have better corrosion resistance than terrific 4xx stainless steels. Molybdenum can also be added to make more complex stainless steels like alloys 15-15 and 316 and other alloy steel compositions if required for particular application. Additionally, silicon can be added from doping gases and is useful in stabilizing austenitic stainless steels. It will further be understood by one skilled in the art that virtually an unlimited number of compositions of 3-D parts can be manufactured in accordance with the present invention by varying and/or combining various metal-containing CVD gasses utilized in the inventive AM process and system.

Conductive polymers are a relatively new class of organic polymers that have electrical conductivity far exceeding the extremely low electrical conductivity of conventional polymers. In a modification of the main teachings of the present invention, conductive polymers could be 3-D printed and then additive manufactured using electroplating or electroless processes, such as, for example, electroless nickel. In another embodiment, conventional polymers or polymer composites can be 3-D printed, and then painted, sprayed or vapor deposited with a conductive layer. The part can then be additive manufactured using electroplating or electroless plating.

It will be apparent to those skilled in the art that numerous modifications and variations of the described examples and embodiments are possible in light of the above teachings of the disclosure. The disclosed examples and embodiments are presented for purposes of illustration only. Other alternative embodiments may include some or all of the features disclosed herein. Therefore, it is the intent to cover all such modifications and alternative embodiments as may come within the true scope of this invention, which is to be given the full breadth thereof. Additionally, the disclosure of a range of values is a disclosure of every numerical value within that range.

It should also be understood that all references identified and/or referenced herein are incorporated fully by reference herein in their entireties.

We claim:

1. A method of producing a 3-dimensional ("3-D") product from metals in the gaseous state, the method comprising the steps of:
   providing a substrate of 3-D shape;
   providing a flow of a gaseous chemical compound around the 3-D substrate, wherein the gaseous chemical compound comprises a metal carbonyl gas;
   selectively heating/cooling regions of the 3-D substrate to decompose the metal carbonyl gas, wherein metal separated as a result of the decomposition of the metal is deposited on the 3-D substrate;
   controlling a flow rate of the metal carbonyl gas and the temperature distribution of the 3-D substrate to achieve a desired spatial thickness distribution of the metal on the 3-D substrate; and
   removing the 3-D substrate to produce a resulting 3-D metal product,
   wherein the 3-D substrate comprises a plastic or polymer 3-D substrate, and wherein the plastic or polymer 3-D substrate is removed by melting, dissolving or burning to produce the resultant 3-D metal product.

2. The method of claim 1, wherein the metal in the metal carbonyl gas comprises nickel or iron.

3. The method of claim 1, wherein the 3-D substrate is selectively heated/cooled to temporally and spatially varying temperatures that are less than the melting point of the metal included in the metal carbonyl gas molecular constituents.

4. The method of claim 1, wherein the flow rate, pressure and temperature of the metal carbonyl gas and the temporally and spatially varying temperature distribution of the 3-D substrate are controlled by a CAD/CAM file.

5. The method of claim 1, further comprising the step of adding doping gases to the metal carbonyl gas to improve mechanical and/or physical properties of the deposited metal.

6. The method of claim 5, wherein the doping gases include boron, silicon, nitrogen and/or carbon as molecular constituents.

7. The method of claim 1, further comprising the step of adding elements to the metal carbonyl gas to provide corrosion and/or wear resistance for the deposited metal.

8. The method of claim 1, wherein the 3-D substrate includes particles selectively disbursed therein to selectively control the thermal conductive properties throughout the 3-D substrate.

9. The method of claim 1, wherein the 3-D substrate includes one or more phase-change materials selectively embedded therein to selectively control the thermal conductive properties and temperature distribution throughout the 3-D substrate.

10. The method of claim 1, wherein the 3-D substrate includes at least one embedded resistant heater or hot plate to selectively control the spatial and temporal temperature distribution throughout the 3-D substrate.

11. A method of producing a 3-dimensional ("3-D") product from metals in the gaseous state, the method comprising the steps of:
providing a substrate of 3-D shape;
providing a flow of a gaseous chemical compound around the 3-D substrate, wherein the gaseous chemical compound comprises a metal carbonyl gas;
selectively heating/cooling regions of the 3-D substrate to decompose the metal carbonyl gas, wherein metal separated as a result of the decomposition of the metal is deposited on the 3-D substrate; and
controlling a flow rate of the metal carbonyl gas and the temperature distribution of the 3-D substrate to achieve a desired spatial thickness distribution of the metal on the 3-D substrate,
wherein the 3-D substrate comprises a plastic or polymer 3-D substrate formed from an additive manufacturing process.

12. A method of producing a 3-dimensional ("3-D") product from metals in the gaseous state, the method comprising the steps of:
providing a substrate of 3-D shape;
providing a flow of a gaseous chemical compound around the 3-D substrate, wherein the gaseous chemical compound comprises a metal carbonyl gas;
selectively heating/cooling regions of the 3-D substrate to decompose the metal carbonyl gas, wherein metal separated as a result of the decomposition of the metal is deposited on the 3-D substrate; and
controlling a flow rate of the metal carbonyl gas and the temperature distribution of the 3-D substrate to achieve a desired spatial thickness distribution of the metal on the 3-D substrate,
wherein the 3-D substrate includes at least one passageway formed therein, the at least one passageway receiving at least one heating/cooling fluid to selectively heat/cool regions of the 3-D substrate and selectively control the deposition rate of the metal throughout the surface of the 3-D substrate.

13. A method of producing a 3-dimensional ("3-D") product from metals in the gaseous state, the method comprising the steps of:
providing a substrate of 3-D shape;
providing a flow of a gaseous chemical compound around the 3-D substrate, wherein the gaseous chemical compound comprises a metal carbonyl gas;
selectively heating/cooling regions of the 3-D substrate to decompose the metal carbonyl gas, wherein metal separated as a result of the decomposition of the metal is deposited on the 3-D substrate; and
controlling a flow rate of the metal carbonyl gas and the temperature distribution of the 3-D substrate to achieve a desired spatial thickness distribution of the metal on the 3-D substrate,
wherein the 3-D substrate includes a plurality of passageways formed therein, the plurality of passageways receiving a heating/cooling fluid heated to a temporally and spatially varying temperature to selectively heat/cool regions of the 3-D substrate and selectively control the deposition of the metal throughout the surface of the 3-D substrate.

14. The method of claim 13, wherein the select temperature of the heating/cooling fluid in the plurality of passageways is different in each passageway and over time to achieve different thicknesses of the metal deposited on the 3-D substrate.

15. The method of claim 13, wherein different heating fluids are provided in the plurality of passageways.

16. A method of producing a 3-dimensional ("3-D") product from metals in the gaseous state, the method comprising the steps of:
providing a substrate of 3-D shape;
providing a flow of a gaseous chemical compound around the 3-D substrate, wherein the gaseous chemical compound comprises a metal carbonyl gas;
selectively heating/cooling the 3-D substrate to selectively decompose the metal carbonyl gas, wherein metal separated as a result of the decomposition is selectively deposited on the 3-D substrate, wherein different regions of the 3-D substrate are temporally heated/cooled to different temperatures such that the metal is deposited in different thickness on the different regions of the 3-D substrate and/or previously deposited material;
selectively controlling a flow rate and pressure of the metal carbonyl gas and the temperature distribution within the 3-D substrate to achieve a desired spatially varying thickness of the metal on the 3-D substrate; and
removing the 3-D substrate to produce a resulting 3-D metal product.

17. The method of claim 16, wherein the 3-D substrate includes a plurality of passageways formed therein, the plurality of passageways receiving at least one heating/cooling fluid heated to a select temporal temperature or temperatures to selectively heat/cool regions of the 3-D substrate and selectively control the deposition of the metal on the 3-D substrate.

18. The method of claim 16, wherein the 3-D substrate includes particles selectively disbursed therein to selectively control the thermal conductive properties throughout the 3-D substrate.

19. The method of claim 16, wherein different metals are deposited in a through-thickness direction at selected regions throughout the resulting 3-D metal product.

* * * * *